United States Patent

[11] 3,590,336

[72] Inventors Akio Yamashita; Takehiro Tsuzaki, both of Osaka, Japan
[21] Appl. No. 731,384
[22] Filed May 23, 1968
[45] Patented June 29, 1971
[73] Assignee Matsushita Electric Industrial Co., Ltd. Osaka, Japan
[32] Priority May 26, 1967
[33] Japan
[31] 42/33850

[54] BENDING FORCE SENSITIVE MECHANO-ELECTRICAL CONVERTING DEVICE EMPLOYING A SEMICONDUCTOR DIAPHRAGM
3 Claims, 2 Drawing Figs.

[52] U.S. Cl. .......... 317/234 R, 317/235 R, 317/234 S, 317/235 M, 317/235 UA
[51] Int. Cl. .......... H01l 3/00, H01l 5/00
[50] Field of Search .......... 317/235–/26, 234

[56] References Cited

UNITED STATES PATENTS

| | | | |
|---|---|---|---|
| 3,102,420 | 9/1963 | Mason | 317/235 X |
| 3,320,568 | 5/1967 | Russell et al. | 317/235 X |
| 3,406,572 | 10/1968 | Robillard | 73/398 |
| 3,423,823 | 1/1969 | Ansley | 29/578 |
| 3,394,289 | 7/1968 | Lindmayer | 317/235 |
| 3,420,776 | 1/1969 | Hepplewhite et al. | 317/235 |

FOREIGN PATENTS

| | | | |
|---|---|---|---|
| 1,055,418 | 1/1967 | Great Britain | 317/235 |

*Primary Examiner*—John W. Huckert
*Assistant Examiner*—Andrew J. James
*Attorney*—Stevens, Davis, Miller & Mosher

ABSTRACT: A mechano-electrical converting device comprising a semiconductor wafer doped with a deep level impurity and having a thickness of 100 microns or less, and at least two electrical connections. When a bending stress is given to the semiconductor wafer, the electrical resistance thereof varies markedly.

Figure 1:
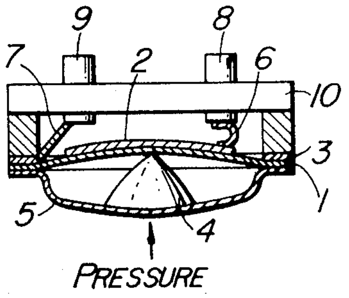

INVENTORS
Akio Yamashita
Takehiro Tsuzaki
BY Stevens, Davis, Miller & Mosher
ATTORNEYS

BENDING FORCE SENSITIVE MECHANO-ELECTRICAL CONVERTING DEVICE EMPLOYING A SEMICONDUCTOR DIAPHRAGM

This invention relates to a device converting a mechanical signal to an electrical signal with a high sensitivity and being extremely durable against mechanical distortion.

It has been the practice in devices converting a mechanical signal to an electrical signal through the use of a semiconductor to apply a mechanical signal to the PN junction of a diode or a transitor, to utilize the variation in electric resistance due to the bending stress of the semiconductor monocrystal bulk, or to use a semiconductor polycrystal thin film.

In the case of a PN junction semiconductor, monocrystal must be used. Moreover, it is necessary that the PN junction be rather close to the stress portion. When excess stress is applied, the PN junction is locally destroyed, thereby increasing the leakage current. In the case of a semiconductor monocrystal bulk, a large bending should be avoided due to the considerable thickness of the bulk. The semiconductor polycrystal film has a low yield, and has difficulty in acquiring a constant sensitivity. Because these kinds of material have a poor sensitivity, they have not been used very much as mechano-electrical converting devices.

This invention obviates these defects and provides a mechano-electrical converting device having a high sensitivity, good stability and reproducibility and a large mechanical strength, characterized in that a bending stress is given to semiconductor material of less than 100$\mu$ thickness having at least two electrical connections and comprising an impurity forming a deep level in the forbidden band thereby to give rise to a variation in the electric resistance.

In the past, a semiconductor monocrystal wafer could not be cut thinner than about 150 $\mu$. However, polishing and etching have made it possible to produce a semiconductor wafer as thin as 100 $\mu$. The wafer thus produced is able to withstand bending and has acquired flexibility and durability.

Using such characteristics of a semiconductor, the inventors have succeeded in fabricating an extremely sensitive mechano-electrical converting device by adding a deep level impurity to a semiconductor of less than 100 $\mu$ thickness and providing at least two electrical connections thereto.

Previously, the inventors found that the addition of a deep level impurity to a semiconductor could remarkably improve the sensitivity of a mechano-electrical device. Further, it was also found that the bending stress of a thinned semiconductor can be utilized to increase the reliability of mechanical strength of the device.

The object of this invention is to provide a mechano-electrical converting device characterized in that a mechanical signal is given to the semiconductor material of less than 100 $\mu$ thickness having at least two electric connections and comprising an impurity forming a deep level in the forbidden band thereby giving rise to a variation in electric resistance.

Figure 2:
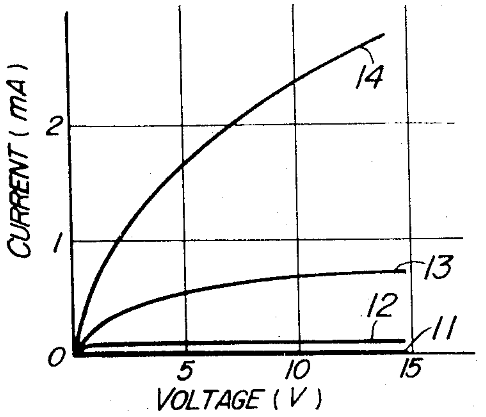

Other objects, advantages and features of this invention will be apparent from the following description with reference to the accompanying drawings, in which;

FIG. 1 is a partial sectional front view of a mechano-electrical converting device in one embodiment of this invention; and FIG. 2 shows current-voltage characteristics of the device.

Detailed explanation of an embodiment of this invention will be made hereinafter.

A silicon N-type semiconductor having a resistivity of 10 Ωcm. is cut 110 $\mu$ thick perpendicularly to the direction of (111) axis. When the semiconductor is polished to 100 $\mu$, the semiconductor piece becomes very rich in flexibility. Copper is evaporated in a vacuum on one side of this thin semiconductor piece. Heat treatment is applied at 1000° C in a hydrogen gas atmosphere to diffuse the copper in the silicon. Next, planar type electrodes, one being ohmic and the other having a Schottky barrier, are provided on one surface. FIG. 1 shows the inventive mechano-electrical converting device thus obtained.

A semiconductor piece 1 is obtained by diffusing copper in flexible disclike silicon having a thickness less than 100 $\mu$. An Au electrode 2 has a Schottky barrier. A ringlike Au (0.8 percent Sb) electrode 3 is in ohmic contact with the semiconductor piece 1. A needle 4 for applying stress, is fitted to a resilient plate 5 which transmits the mechanical energy to the semiconductor piece. A lead wire 6 is led out from the Au electrode 2. A lead wire 7 is led out from the ohmic Au (0.8 percent Sb) electrode 3. Terminals 8 and 9 are connected to the lead wires 6 and 7, respectively, and 10 is a pedestal.

FIG. 2 shows current-voltage characteristics between the terminals 8 and 9 of this device. Curves 11, 12, 13 and 14 show the characteristics for the pressures $010^2$, $5\times10^2$, and $5\times10^3$ g./cm.$^2$ respectively.

From this it can be seen that the electric resistance varies remarkably with an increase of pressure, especially around $10^2$ g./cm.$^2$. Therefore, the device has a sensitivity which is $10^3$ times as high as that of a conventional transducer.

As shown in FIG. 1, stress is applied to only one surface of the semiconductor piece 1 without the electrode 2 so that the mechanically weak electrode 2 is protected. Thus, the reliability and stability are largely improved.

Although in the above embodiment a silicon semiconductor is used, other kinds of semiconductor such as Ge, GaAs and GaP may be used with a similar effect. They also obtain flexibility when polished to less than 100 $\mu$ thickness. Au, Co, Ni, and Fe may be used as the impurity diffused to form a deep level in the semiconductor to the same effect as Cu.

A PN junction may be used in place of the electrode having the Schottky barrier as shown in FIG. 1. Further, the effect of this invention does not vary essentially even though more than two electric connections are provided.

As described in detail hereinabove, a mechano-electrical converting device according to this invention has an extremely high sensitivity. It may be used as a variable resistor, a pressure gauge, a flow meter, a water level meter, etc. Therefore, the invention has great industrial merit.

What we claim is:

1. A mechano-electrical converting device comprising a semiconductor wafer doped with a deep level impurity and having a thickness not greater than 100 microns, said semiconductor varying its electrical resistance when a bending stress is applied thereto, means for applying bending stress to said semiconductor wafer, and at least two electrical connections to said semiconductor wafer, at least one of said electrical connections having a Schottky barrier.

2. A mechano-electrical converting device according to claim 1 wherein at least one of said electrical connections is in ohmic contact with said wafer.

3. A mechano-electrical converting device according to claim 1 wherein said semiconductor wafer is silicon doped with copper.